Nov. 15, 1966 J. H. DEVESON 3,286,106

AMPLITUDE CLIPPING CIRCUITS

Filed Nov. 20, 1964

INVENTOR
John Harwood Deveson
BY
Baldwin & Wight
ATTORNEYS

United States Patent Office 3,286,106
Patented Nov. 15, 1966

3,286,106
AMPLITUDE CLIPPING CIRCUITS

John Harwood Deveson, Chelmsford, Essex, England, assignor to The Marconi Company Limited, London, England, a British company Filed Nov. 20, 1964, Ser. No. 412,633
Claims priority, application Great Britain, Feb. 17, 1964, 6,424/64
3 Claims. (Cl. 307—88.5)

This invention relates to amplitude clipping circuit arrangements and has for its object to provide improved and simple amplitude clipping circuit arrangements which will give considerably better performance at high frequencies than the usual known comparable arrangements. Though not limited to its application thereto, the invention is very suitable for use as a so-called "clipper" in television circuits.

Figure 1:
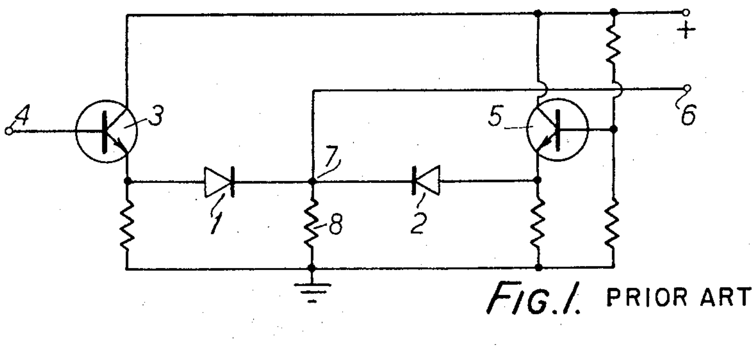
FIG. 1. PRIOR ART
Figure 2A:
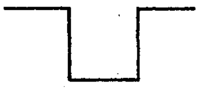
Figure 2B:
Figure 2C:
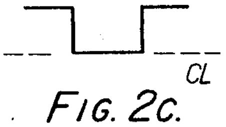
Figure 3A:
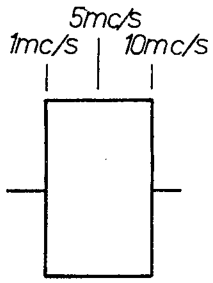
Figures 3B, 3C:
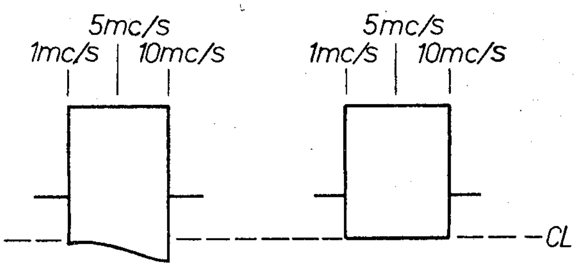
Figure 4:
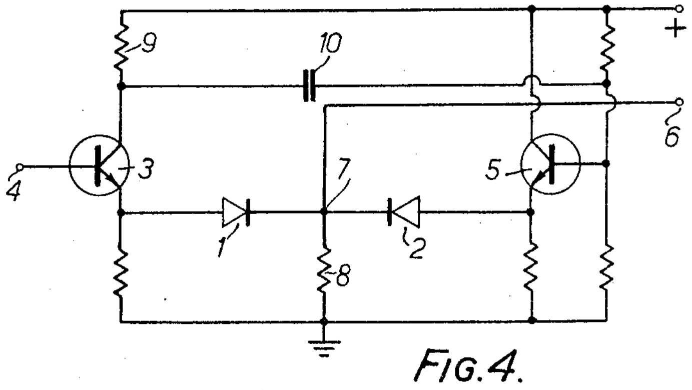

The invention is illustrated in and explained in connection with the accompanying drawings, in which: FIG. 1 is a circuit diagram of a prior art clipper commonly used at the present time in television circuits; FIGS. 2*a*, 2*b*, 2*c* and 3*a*, 3*b*, 3*c* are waveforms illustrating the performance at high frequency of the prior art clipper shown in FIG. 1 in comparison with an "ideal," i.e. a perfect clipper; and FIG. 4 is a circuit diagram of an embodiment of this invention.

FIG. 1 is an example of a widely used clipper of the type commonly termed a double diode, series-shunt clipper, which employs two semi-conductor diodes 1 and 2 connected back to back. The first diode, 1, is fed with input signals from a low impedance source shown as constituted by a transistor 3 connected as an emitter follower. Signals to be clipped are applied to the base of transistor 3 from an input terminal 4. The second diode 2 is connected to a low impedance source of clipping reference potential provided by a second transistor 5 also connected as an emitter follower. A reference potential is applied to the base of transistor 5, e.g. from a potentiometer as shown. Clipped output is taken off at output terminal 6 from the junction point 7 of the diodes, which point is also connected to ground through a small current bleeder resistor 8. The particular arrangement shown in FIG. 1 is for clipping negative going input signals but, obviously, by reversing the diodes and returning resistor 8 to a positive potential source instead of to ground positive going input signals at 4 could be clipped.

At any given moment one only of the diodes 1 and 2 will conduct, and the other will not, the diode which is, at the moment, conductive being determined by the input signal amplitude at 4. Thus if, at any given moment, the emitter of the transistor 5 is more positive than that of transistor 3, diode 2 conducts and diode 1 does not with the result that the output terminal 6 is effectively disconnected from the input terminal 4 by the diode 1. If, however, the emitter of transistor 3 becomes more positive than that of transistor 5, only diode 1 conducts, and the input is connected to the output therethrough.

This well known type of circuit is quite satisfactory if the signal frequency is not too high, but at high frequencies the self-capacitance of the diodes and the fact that their "turn-off" and "turn-on" times are relatively slow with respect to high frequency transitions cause imperfect operation. The diode imperfections cause "break through" at high frequencies and, in particular, this manifests itself by "overshooting" when it is sought to clip pulses with fast rise times such as are encountered in television. Such imperfect operation is typified by FIGS. 2*b* and 3*b*. FIG. 2*a* shows an input pulse with a very fast rise time which is desired to be clipped; FIG. 2*b* shows the output pulse after clipping (the overshoot of the leading edge of the clipped output pulse will be noted); and FIG. 2*c* shows, for the purpose of comparison, the clipped output pulse which would have been obtained if the clipper were a perfect one. The broken line CL in FIG. 2*b* and 2*c* represents the clipping level. This can, of course, be adjusted by adjusting the reference potential applied to the base of transistor 5. FIGS. 3*a*, 3*b* and 3*c* similarly illustrate the case in which the input signal is a video sweep signal, sweeping, in the example illustrated from 1 mc./s. to 10 mc./s., the envelopes only of the signal being shown. FIG. 3*a* shows the input signal; FIG. 3*b* shows the clipped output signal actually obtained; and FIG. 3*c* shows the clipped output signal which would be given by a perfect clipper. As before, line CL represents the clipping level.

The present invention seeks to avoid or reduce the imperfections of operation which are above referred to and which occur at high frequencies.

According to this invention, an amplitude clipping circuit arrangement of the kind including two rectifiers back to back, means for taking clipped output signals from a point between said rectifiers, means for applying input signals to be clipped to the remaining side of one of said rectifiers and means for applying a clipping reference potential to the remaining side of the other of said rectifiers comprises, in addition, means for applying to said remaining side of said other rectifier corrective signals derived from said input signals by inversion and differentation.

In a preferred arrangement the rectifiers are semi-conductor diodes; the input signals are applied to said one rectifier through a transistor connected as an emitter follower; the clipping reference potential is applied to said other rectifier by means of a second transistor also connected as an emitter follower; and the correcting signals are derived and applied by means of a condenser included in circuit between the collector of the first mentioned transistor and the base of the second transistor and an impedance in the collector circuit of said first mentioned transistor.

According to a feature of this invention, an amplitude clipping circuit arrangement comprises an input emitter follower transistor; means for applying signals to be clipped to the base thereof; a collector circuit including a resistor for said input transistor; a second emitter follower transistor; means for applying a clipping reference potential to the base of said second transistor; two semiconductor diodes connected back to back at one side thereof with the remaining side of one diode connected to the emitter of the input transistor and the remaining side of the other diode connected to the emitter of the second transistor; a resistor connected between a poiint between said diodes and a point of fixed potential; a condenser connected between the collector of the input transistor and the base of the second transistor; and means for taking clipped output signals from a point between said diodes.

FIG. 4 shows an embodiment of the invention which, like FIG. 1 is designed to clip negative going signals. Like references are used for like parts in FIGS. 1 and 4 so little further description of the latter figure is necessary.

As will be seen, the circuit of FIG. 4 differs from FIG. 1 by the insertion of resistor 9 in the collector circuit of transistor 3 and the provision of condenser 10 between the collector of transistor 3 and the base of transistor 5. These additional elements operate by adding at the base of transistor 5 a signal derived from the input signal by inversion and differentiation. The inversion is, of course, performed by the input transistor 3 and the resistor 9, the inverted signal being taken off at the junction of the collector of transistor 3 and resistor 9. This signal is differentiated by the circuit comprising condenser 10 and the two resistors coupled in the base circuit of transistor 5. The above noted inverted and differentiated signal acts as a correcting signal so modifying the reference potential at the emitter of transistor 5 as very considerably to reduce break through of the diodes at higher frequencies. The correcting signal reduces the break through of the diodes by applying a signal which is approximately equal and opposite to the voltage developed by the breakthrough, thereby cancelling out the voltage spike caused by the breakthrough and more nearly approximating ideal clipping action. By properly choosing the values of the components 9 and 10, it is possible to obtain, from input signals as shown in FIGS. 2*a* and 3*a*, output signals which more closely approximate the ideal output signals shown in FIGS. 2*c* and 3*c* respectively than do the output signals shown in FIGS. 2*b* and 2*c* respectively. As before, by reversing the diodes 1 and 2 and returning resistor 8 to a positive potential point, positive going input signals can be clipped.

While one form of the invention has been shown for purposes of illustration, it is to be understood that various changes in the details of construction and arrangement of parts may be made without departing from the spirit and scope of the invention as defined in the appended claims.

I claim:

1. An amplitude clipping circuit comprising two rectifiers coupled back to back at one side thereof, means for applying input signals to be clipped to the remaining side of one of said rectifiers, means for applying a clipping reference potential to the remaining side of the other of said rectifiers, means for taking clipped output signals from a point between said rectifiers, and inverter-differentiator means for applying to said remaining side of said other rectifier correcting signals derived from said input signals by inversion and differentiation.

2. A circuit as claimed in claim 1 wherein the rectifiers are semi-conductor diodes; the input signals being applied to said one rectifier through a transistor connected as an emitter follower; the clipping reference potential being applied to said other rectifier through a second transistor also connected as an emitter follower; and the correcting signals being derived of a condenser included in circuit between the collector of the first mentioned transistor and the base of the second transistor and an impedance in the collector circuit of said first mentioned transistor.

3. An amplitude clipping circuit comprising an input emitter follower transistor; means for applying signals to be clipped to the base of said transistor; a collector circuit including a resistor for said input transistor; a second emitter follower transistor; means for applying a clipping reference potential to the base of said second transistor; two semi-conductor diodes connected back to back at one side thereof with the remaining side of one diode being connected to the emitter of the input transistor and the remaining side of the other diode being connected to the emitter of the second transistor; a resistor connected between a point between said diodes and a point of fixed potential; a condenser connected between the collector of the input transistor and the base of the second transistor; and means for taking clipped output signals from a point between said diodes.

References Cited by the Examiner

UNITED STATES PATENTS

| | | | |
|---|---|---|---|
| 3,181,076 | 4/1965 | Freseman et al. ---- | 328—169 X |
| 3,221,258 | 11/1965 | Pay ---------------- | 328—171 |

ARTHUR GAUSS, *Primary Examiner.*

J. ZAZWORSKY, *Assistant Examiner.*